US006043467A

United States Patent [19]

Little

[11] Patent Number: 6,043,467

[45] Date of Patent: Mar. 28, 2000

[54] THICK FILM ELEMENTS

[75] Inventor: Peter James Little, Marshfield, United Kingdom

[73] Assignee: Otter Controls Limited, Buxton, United Kingdom

[21] Appl. No.: 08/836,998

[22] PCT Filed: Nov. 27, 1995

[86] PCT No.: PCT/GB95/02750

§ 371 Date: May 9, 1997

§ 102(e) Date: May 9, 1997

[87] PCT Pub. No.: WO96/17497

PCT Pub. Date: Jun. 6, 1996

[30] Foreign Application Priority Data

Nov. 26, 1994 [GB] United Kingdom .................. 9423900

[51] Int. Cl.[7] .............................. H05B 3/06; H01L 1/012

[52] U.S. Cl. ........................................... 219/542; 338/306

[58] Field of Search .................................. 219/203, 522, 219/542, 543, 547, 464, 465, 528, 466, 468, 449, 438, 441, 544; 338/13, 22 R, 225 D, 306–309; 392/444, 441; 337/303–309

[56] References Cited

U.S. PATENT DOCUMENTS

| | | | |
|---|---|---|---|
| 3,725,643 | 4/1973 | Clausse | 219/441 |
| 3,784,788 | 1/1974 | Fourny | 219/441 |
| 4,286,377 | 9/1981 | Hurko et al. | 29/612 |
| 4,310,748 | 1/1982 | Paulin | 219/437 |
| 4,544,830 | 10/1985 | Miller | 219/328 |
| 4,829,280 | 5/1989 | Blackburn et al. | 337/299 |
| 4,859,835 | 8/1989 | Balderson | 219/543 |
| 5,177,341 | 1/1993 | Balderson | 219/543 |
| 5,459,812 | 10/1995 | Taylor | 392/498 |
| 5,635,092 | 6/1997 | O'Neil | 219/441 |
| 5,642,725 | 7/1997 | Sharples | 126/369 |
| 5,793,020 | 8/1998 | O'Neil | 219/441 |

*Primary Examiner*—Teresa Walberg
*Assistant Examiner*—Daniel Robinson
*Attorney, Agent, or Firm*—Harrison & Egbert

[57] ABSTRACT

A thick film resistive heating element having a thick film resistive track applied to the surface of an electrically insulative substrate. An encapsulating insulating layer is applied over the track to protect it while an area of the element is left uncovered by the encapsulating layer so as to define a window. A portion of a temperature sensitive control device is then placed in direct contact with the track and/or the electrically insulative substrate through the window. The window in the element is located in that area of the element which will be uncovered by the liquid prior to the rest of the element as the liquid boils away or is evacatuated from the vessel.

6 Claims, 3 Drawing Sheets

THICK FILM ELEMENTS

TECHNICAL FIELD

The present invention relates to thick film resistive heating elements such as can be used particularly but not exclusively in liquid heating appliances such as water boilers, kettles and the like.

BACKGROUND ART

Owing to the low thermal mass of such elements and their generally low vaporization temperature, it is necessary to protect them from overheating in the event of incorrect use of appliances to which they are fitted or malfunction of the element itself.

Conventionally, a mineral insulated element is protected by an electromechanical device such as a domed bi-stable, bi-metallic blade which is arranged so that it adopts a stable position in contact with a part of the element and thereby retains a switch in the electrical supply circuit to the element in a position which maintains the electrical supply. However, should the temperature of the element rise above a predetermined threshold temperature which is above the normal operating range, then the blade will move into its other stable position and cause the switch to operate to cut off the electrical supply to the element. As soon as the temperature of the blade drops below the threshold temperature then it will revert back to its original stable position to enable the electrical supply to be once more restored to the element.

As a back-up to the blade in the event that it should fail to function correctly, part of the device is made of a fusible or thermoplastic material which is designed to melt or to soften if a second predetermined threshold temperature higher than the aforesaid first temperature is reached. This is intended to cause the switch to disconnect and thereby permanently cut off the electrical supply to the element.

However, as thick film resistive heating elements have a low thermal mass, the rate of rise of temperature under fault conditions is so high that it is not sufficient simply to arrange an electromechanical control device as described above in contact with such an element in the same way as with a mineral insulated element to protect it from damage and to ensure that it will operate efficiently.

It is, therefore, an object of the present invention to provide a thick film resistive heating element which is adapted for use with a conventional electromechanical controller similar to the type described above.

SUMMARY OF THE INVENTION

According to a first aspect of the present invention there is provided a thick film resistive heating element comprising a thick film resistive track applied to the surface of an electrically insulative substrate and over which is applied an encapsulating insulating layer to protect the track, and characterized in that an area of the element is left uncovered by the encapsulating layer to define a window through which a temperature sensitive control device can be placed in direct contact with the track and/or the electrically insulative substrate.

Preferably, the power density of the track is increased in said window area over the average power density of the rest of the track.

Preferably also, in the area of the window and beyond, the resistive track comprises a plurality of parallel tracks which are concentrated in the area of the window to provide a uniform temperature distribution.

Preferably also, the lengths of the parallel tracks are balanced so that adjacent tracks are substantially at equipotential.

If a portion of the temperature sensitive control device is placed in direct contact with the track, then preferably the lengths of the tracks in direct contact with the temperature sensitive control device are made substantially equal along their center line. Alternatively, if a portion of the temperature sensitive control device is placed in direct contact with the electrically insulative substrate, then preferably at least two parallel tracks loop around each side of window portion in close proximity thereto.

Preferably also, the plurality of tracks are arranged to cover that area of the element adjacent the location of the control device to increase the heat transference to the whole of the device and not only that portion which is in direct contact with the track and/or the electrically insulative substrate through the window.

According to a second aspect of the present invention there is provided a heating apparatus comprising a vessel defining a chamber for heating liquid and a thick film resistive heating element for the liquid according to the first aspect of the present invention, the window in the element being located in an area of the element which will be uncovered by the liquid prior to the rest of the element as the liquid boils away or is evacuated from the vessel.

Preferably, the element is mounted at an angle to the horizontal with the window in an elevated location with respect to a larger part of the element whereby as the liquid boils dry the window is uncovered by the liquid prior to the larger part of the element.

Preferably also, the vessel is adapted for pouring the liquid and the window in the element is located further from the pivot point of the apparatus than a major part of the element whereby the window is uncovered by the liquid prior to said major part of the element as the liquid is poured out of the vessel.

BRIEF DESCRIPTION OF THE DRAWINGS

The various aspects of the present invention will now be described by way of example with reference to the accompanying drawings, in which.

DETAILED DESCRIPTION OF THE INVENTION

Figure 1:
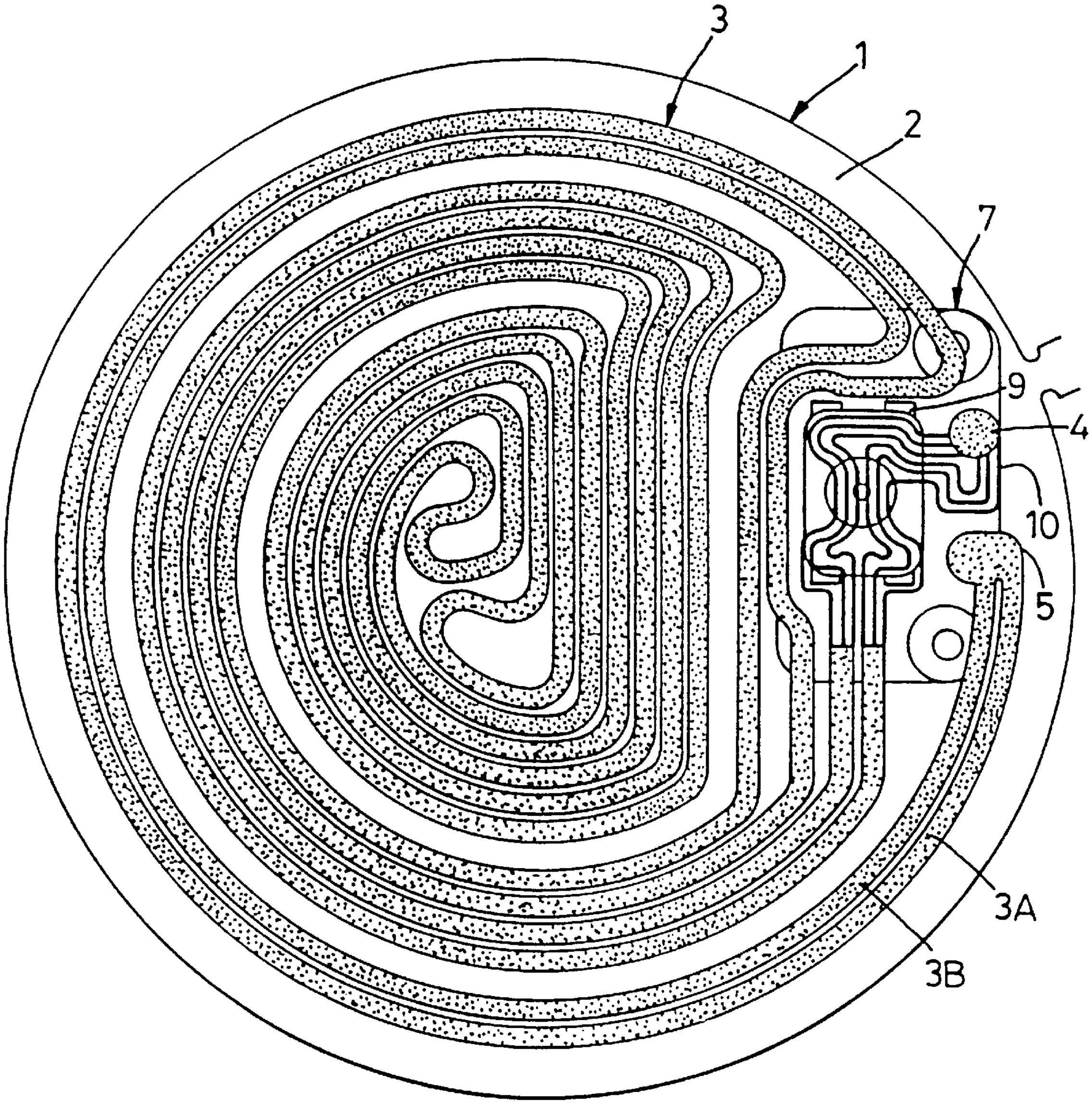
FIG. 1 shows a thick film resistive heating element according to the first aspect of the present invention in combination with a temperature sensitive control device.

With reference to the drawings, a thick film resistive heating element 1 is formed by initially firing a stainless steel substrate 2 in an oven to form a chromium oxide surface layer, the firing process being carried out at a temperature of 850° C. to 900° C. A first dielectric adhesion layer is then adhered to the oxidized steel substrate 2, the adhesion layer being selected to have a coefficient of thermal expansion approximately equal to that of the steel. One or more further separate coatings are then separately applied such that the final coating has a coefficient of thermal expansion approximately equal to a thick film ink.

A thick film circuit layout is then applied by silk-screen printing in which a conductive track 3 constituting the heating element is printed. The track is preferably formed of palladium silver but may alternatively be made of other conducting materials such as nickel, platinum, silver, or carbon, for example.

Preferably, the track 3 follows a tortuous path over the majority of the area of the substrate 2 to maximize the heated area of the element 1. At its ends, the track 3 terminates in respective contact portions 4 and 5 which are adapted to make electrical connection with an electrical control device for the element 1.

An encapsulating insulating layer is then finally applied over the completed circuit and the substrate to protect the circuit. However, this coating is interrupted in the regions of the contact portions 4 and 5 so that electrical connection can be made thereto.

In addition, the coating is also interrupted in an area delimited by the line 6 to define a window through which the track 3 and/or the electrically insulative substrate 2 is exposed and can thereby be contacted directly.

It is envisaged that the electricity supply to element 1 will be controlled by a temperature sensitive electromechanical device 7 similar to that previously described and comprising a domed bi-stable, bi-metallic blade 8 mounted on fusible or thermoplastic feet 9. To this end, in the area of the element 1 adjacent to which the device 7 will be located, the element 1 is adapted to operate the device 7. This area will now be described in more detail with particular reference to FIG. 2.

Thick film resistive tracks such as the track 3 are usually deposited on the insulated substrate 1 at a constant thickness. However, the width of the track may be varied to vary its resistance. Its resistance is reduced by increasing the width of the track and correspondingly increased by reducing the width of the track. In the examples described here and as shown in the drawings, the track 3 is formed by a pair of parallel tracks 3A and 3B.

As the element 1 is to be controlled by the temperature sensitive control device 7 which can only detect the temperature of that part of the element 1 against which it is located, it is therefore appropriate to ensure that that part runs at a temperature which is at least equal to or preferably higher that the rest. Hence, in order to increase the temperature of this area of the element 1, which is roughly delimited by the total surface area of the blade 8, the local resistance of the tracks 3A and 3B is increased by splitting at least one of them into a plurality of thinner parallel tracks 10A, 10B respectively. The overall width of the tracks 10A, 10B split from each track 3A, 3B is smaller than that of the parent track 3A, 3B respectively so that the power density of the tracks 10A and 10B is greater than that of the tracks 3A and 3B.

Figure 2:
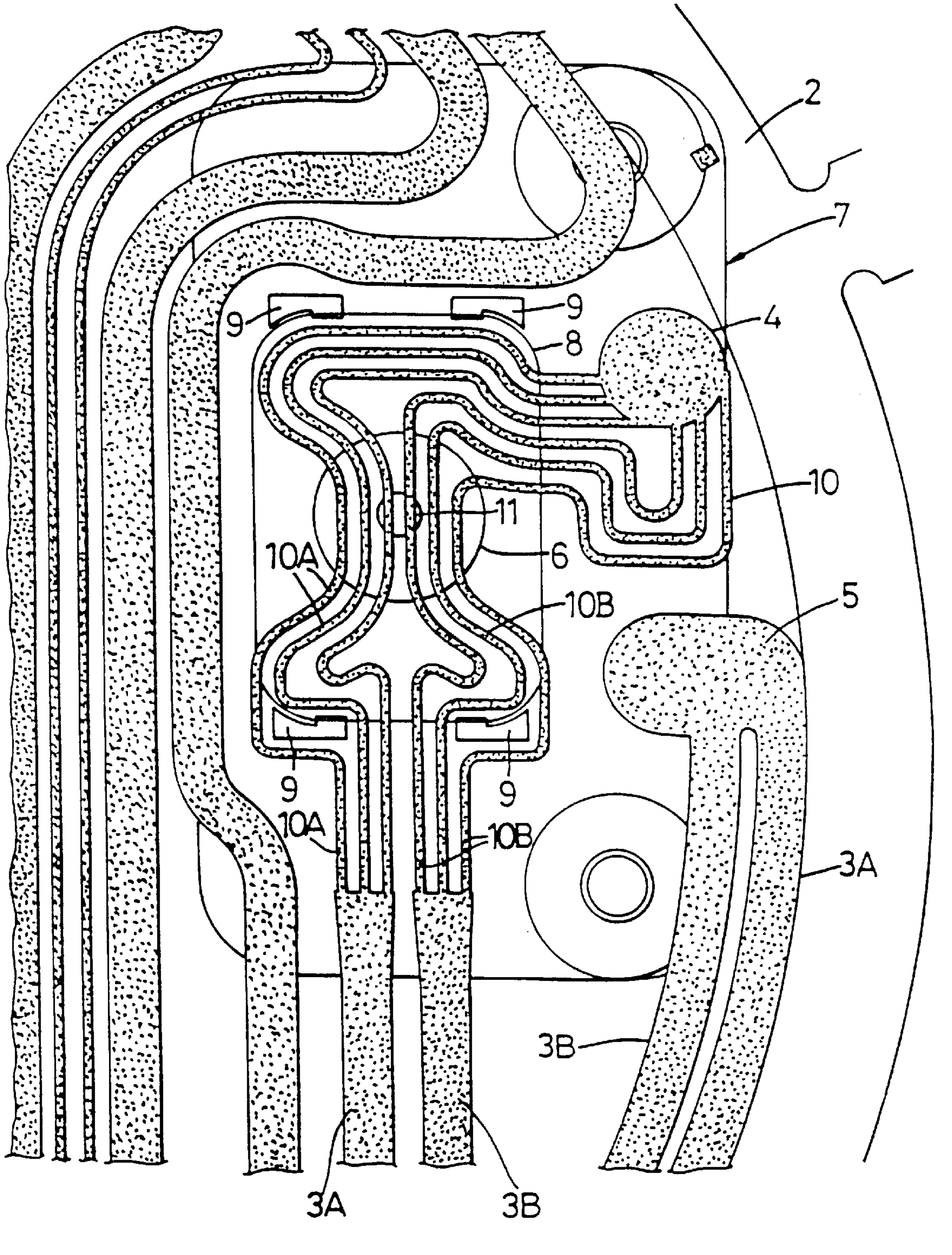
FIG. 2 is a view to an enlarged scale of that part of the element as shown in FIG. 1 wherein the control device is located.

In a first example as shown in FIGS. 1 and 2, each track 3A, 3B is split into three tracks 10A, 10B respectively. The tracks 10A, 10B follow a tortuous path as will be described but they are concentrated together in the area of the window 6. Thus, the power density of the track 3 is increased in the area of the window 6 over the average power density of the rest of the track 3. In this area 6, the blade 8 is domed and projects through the window to contact at least one of each of the tracks 10A, 10B respectively directly in an area 11 at the center of the window 6.

As the domed portion 11 of the blade 8 which actually contacts the tracks 10A, 10B is in effect creating a short circuit across them, the lengths of the parallel tracks 10A, 10B are balanced and the lengths of the tracks 10A, 10B in actual contact with the domed portion of the blade 8 made substantially equal along their center line. This ensures that adjacent contacted tracks 10A, 10B are substantially at equipotential and thereby minimizes arcing or sparking occurring when the blade 8 switches into its second stable position out of contact with the element 1.

As mentioned above, the tracks 10A, 10B follow a tortuous path which is arranged to cover that area of the element 1 adjacent the blade 8 to increase the heat transference as a whole thereto and not only to the domed portion in direct contact with the tracks 10A, 10B. As described above, as a back-up to the blade 8 in the event that it should fail to function correctly, the feet 9 on which it is mounted are designed to melt if a second predetermined threshold temperature higher than the aforesaid first threshold temperature is reached. The control device 7 is designed so that should the feet 9 melt, this has the same effect as if the blade 8 had operated but in this case the electrical supply through the contact portions 4, 5 is permanently cut-off. Thus, the fusible or thermoplastic feet 9 comprise a thermal fuse.

Hence, it is important that heat transfer to the feet 9 is assisted in the event that the blade 8 fails to function correctly. To this end, one or more of the tracks 10A, 10B are arranged to follow a path close to and/or around the areas where the feet 9 will be located in use.

Figure 3:
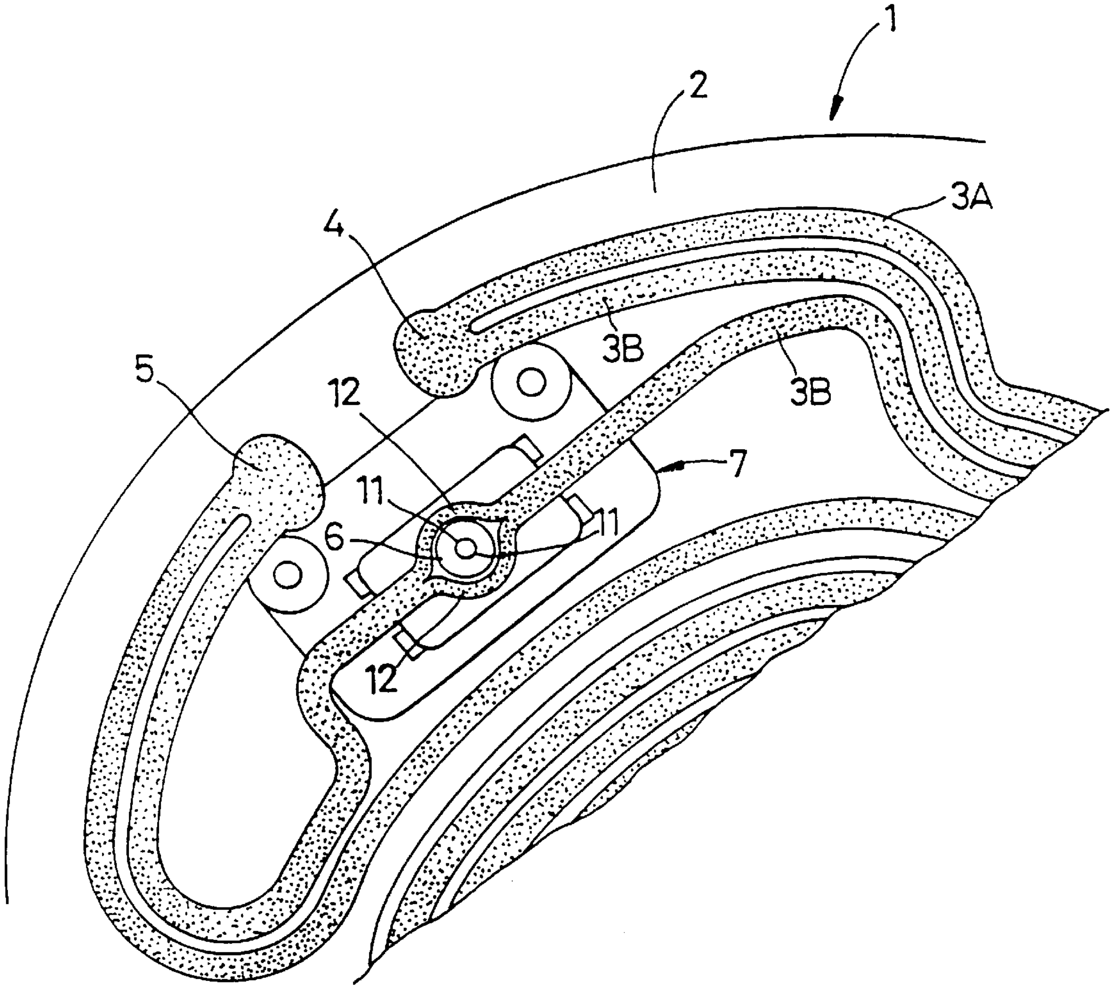
FIG. 3 is a view similar to FIG. 2 but of an element with a modified circuit layout.

In a modification, as shown in FIG. 3, only one, 3B, of the tracks 3A, 3B is used to supply heat to the domed portion of the blade 8. Here, the track 3B is split into two tracks 12 which loop around each side of the area 11 of the dome in close proximity thereto. Hence, the domed portion does not come into direct electrical contact with the track 3 but contacts the underlying insulative substrate 2. However, the tracks 12 are capable of generating heat all around the dome, which heat is readily transmitted thereto. Sufficient heat can, therefore, be transmitted to the blade 8 to cause it to switch into its second stable state out of contact with the substrate 2 if the temperature of the element 1 should exceed the predetermined threshold temperature.

An advantage of the track layout as shown in FIG. 3 is that as the domed portion does not contact the tracks 12 directly, there is no electrical short circuit between the tracks 12. As a result, there is no possibility of sparking occurring when the dome switches into its second stable state.

More generally, and as shown in all the drawings, the area of the element 1 adjacent which the device 7 is located is positioned close to the contact portions 4, 5 at one side of the element 1 but this area could be located at any position over the whole area of the element 1. However, if the element 1 is for use in a heating apparatus for heating liquid, such as a water heating appliance like a kettle, boiler or beverage maker, it is preferable for this area of the element to be located so that it is exposed to higher temperatures than the rest of the element first, during use of the apparatus. Typically, this means that this area of the element should be located in an area of the element 1 which will be uncovered by the liquid prior to the rest of the element 1 as the liquid either boils dry or is evacuated from the appliance.

Hence, in such apparatus the element 1 is preferably mounted at an angle to the horizontal with the window 6 in an elevated location. If this apparatus threatens to boil dry, the window 6 will therefore be uncovered by the liquid prior to the major part of the element 1 and the control device 7 can therefore operate prior to complete exposure of the element 1.

In the case of appliances such as kettles which are adapted to enable liquid to be poured from a vessel, the window 6 in the element 1 is preferably located further from the pivot point of the pour and closer to a handle or a side of the vessel opposite a spout than the major part of the element, whereby the window 6 is uncovered by the liquid prior to the major part of the element as the liquid is poured out of the vessel. As before, this will trigger the control device 7 into operation prior to the vessel being emptied resulting in complete exposure of the element 1. The foregoing disclosure and description of the invention is illustrative and explanatory thereof. Various changes in the details of the illustrated construction may be made within the scope of the appended claims without departing from the true spirit of the invention. The present invention should only be limited by the following claims and their legal equivalents.

I claim:

1. A thick film resistive heating element comprising:

an electrically insulative substrate;

a thick film resistive track applied to a surface of said electrically insulative substrate and terminating in respective electrical contact portions, said resistive track having a thickness; and an encapsulating insulating layer applied to said thick film resistive track but not over said electrical contact portions, said encapsulating insulating layer applied over at least a portion of said surface of said electrically insulative substrate in order to protect said thick film resistive track, an area of said surface of said electrically insulative substrate and of said thick film resistive track being uncovered by said encapsulating insulating layer so as to define a window adapted such that a temperature sensitive controller can be placed in direct contact with at least one of a portion of said thick film resistive track and a portion of said electrically insulative substrate, the resistive track within the window comprises a plurality of tracks which are thinner than the thickness of the resistive track outside the window.

2. The element as claimed in claim 1 wherein a power density of the track is increased in said window over an average power density of a remainder of the track.

3. The element as claimed in claim 1, wherein the plurality of tracks have balanced lengths within the window so that adjacent tracks within the window are substantially at equipotential.

4. The element as claimed in claim 3, wherein the plurality of tracks within the window are arranged so that at least two tracks loop around opposite sides of and in close proximity to a portion of said substrate wherein there is no resistive track.

5. The element as claimed in claim 1 wherein the thick film resistive track outside of said window has a portion thereof extending in close proximity to said window.

6. The element as claimed in claim 1 wherein said substrate has a peripheral edge, said window being positioned adjacent to said peripheral edge.

* * * * *